United States Patent
Midori et al.

(10) Patent No.: US 11,789,056 B2
(45) Date of Patent: Oct. 17, 2023

(54) ELECTROMAGNETIC STIRRER AND REFLECTION CHAMBER

(71) Applicant: TDK CORPORATION, Tokyo (JP)

(72) Inventors: Masataka Midori, Tokyo (JP); Hiroshi Kurihara, Tokyo (JP); Yutaka Sakai, Tokyo (JP); Hiroyuki Nedate, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/636,659

(22) PCT Filed: Jul. 15, 2020

(86) PCT No.: PCT/JP2020/027433
§ 371 (c)(1),
(2) Date: Feb. 18, 2022

(87) PCT Pub. No.: WO2021/049161
PCT Pub. Date: Mar. 18, 2021

(65) Prior Publication Data
US 2022/0291270 A1    Sep. 15, 2022

(30) Foreign Application Priority Data
Sep. 9, 2019   (JP) .................. 2019-163596

(51) Int. Cl.
*G01R 27/32* (2006.01)
*G01R 29/10* (2006.01)
(52) U.S. Cl.
CPC ................. *G01R 29/105* (2013.01)

(58) Field of Classification Search
CPC .............. G01R 29/105; G01R 29/0814; G01R 29/0821; G01R 29/0871; G01R 29/0878; G01R 29/0892; H01Q 15/18; H04B 17/00
See application file for complete search history.

(56) References Cited

U.S. PATENT DOCUMENTS 9,258,067 B2 *   2/2016  Kildal ................... H04B 17/15
9,482,708 B2 *  11/2016  Alhorr .................. G01R 27/32
(Continued)

FOREIGN PATENT DOCUMENTS

CN       206114794       *  4/2017
JP       2000-180489 A      6/2000
(Continued)

OTHER PUBLICATIONS

Sep. 24, 2020 International Search Report issued in International Patent Application No. PCT/JP2020/027433.
(Continued)

*Primary Examiner* — Thang X Le
(74) *Attorney, Agent, or Firm* — Oliff PLC

(57) ABSTRACT

An electromagnetic stirrer including: a shaft body extending in a first direction; and a plurality of stirring blades disposed on the shaft body, in which the plurality of stirring blades include a first stirring blade and a second stirring blade, the first stirring blade and the second stirring blade are aligned from a reference position of the shaft body in the first direction in order of the first stirring blade and the second stirring blade, a shape of the first stirring blade and a shape of the second stirring blade are similar to each other, and a size of the first stirring blade is different from a size of the second stirring blade.

18 Claims, 7 Drawing Sheets

(56) References Cited

U.S. PATENT DOCUMENTS

| | | | | |
|---|---|---|---|---|
| 9,746,423 B2* | 8/2017 | Sayler | ................ | G01R 29/0821 |
| 2019/0339315 A1* | 11/2019 | Sim | ..................... | G01R 31/001 |
| 2020/0341044 A1* | 10/2020 | Kvarnstrand | ...... | G01R 29/0871 |

FOREIGN PATENT DOCUMENTS

| | | |
|---|---|---|
| JP | 2004-347439 A | 12/2004 |
| WO | 2018/179460 A1 | 10/2018 |

OTHER PUBLICATIONS

English translation dated Jul. 4, 2023 Office Action issued in Japanese patent application No. 2019-163596.

\* cited by examiner

ELECTROMAGNETIC STIRRER AND REFLECTION CHAMBER

TECHNICAL FIELD

The present invention relates to an electromagnetic stirrer and a reflection chamber.

Priority is claimed on Japanese Patent Application No. 2019-163596, filed Sep. 9, 2019, the content of which is incorporated herein by reference.

BACKGROUND ART

Technologies for performing a radiation electromagnetic field test (radiation immunity test) using a reflection chamber have been researched and developed.

In relation to this, an electromagnetic stirrer that is disposed inside a reflection chamber and stirs electromagnetic waves inside the reflection chamber using stirring blades to an electric field intensity inside a working volume in which a radiation electromagnetic field test is performed in an area inside the reflection chamber is known (see Patent Literature 1).

CITATION LIST

Patent Literature

[Patent Literature 1]
Japanese Unexamined Patent Application, First Publication No. 2004-347439

SUMMARY OF INVENTION

Technical Problem

Here, inside a reflection chamber, as the uniformity of an electric field intensity inside a working volume becomes higher, a radiation electromagnetic field test having higher accuracy can be performed. However, in a conventional electromagnetic stirrer, there are cases in which it is difficult to improve uniformity of an electric field intensity inside a working volume.

The present invention has been made in consideration of such situations, and an object thereof is to provide an electromagnetic stirrer and a reflection chamber capable of improving uniformity of an electric field intensity inside a working volume.

Solution to Problem

According to one aspect of the present invention, there is provided an electromagnetic stirrer including: a shaft body extending in a first direction; and a plurality of stirring blades disposed on the shaft body, in which the plurality of stirring blades include a first stirring blade and a second stirring blade, the first stirring blade and the second stirring blade are aligned from a reference position of the shaft body in the first direction in order of the first stirring blade and the second stirring blade, a shape of the first stirring blade and a shape of the second stirring blade are similar to each other, and a size of the first stirring blade is different from a size of the second stirring blade.

Advantageous Effects of Invention

According to the present invention, the uniformity of an electric field intensity inside a working volume can be improved.

DESCRIPTION OF EMBODIMENTS

Embodiment

Hereinafter, an embodiment of the present invention will be described with reference to the drawings.

<Configuration of Reflection Chamber>

Figure 1:
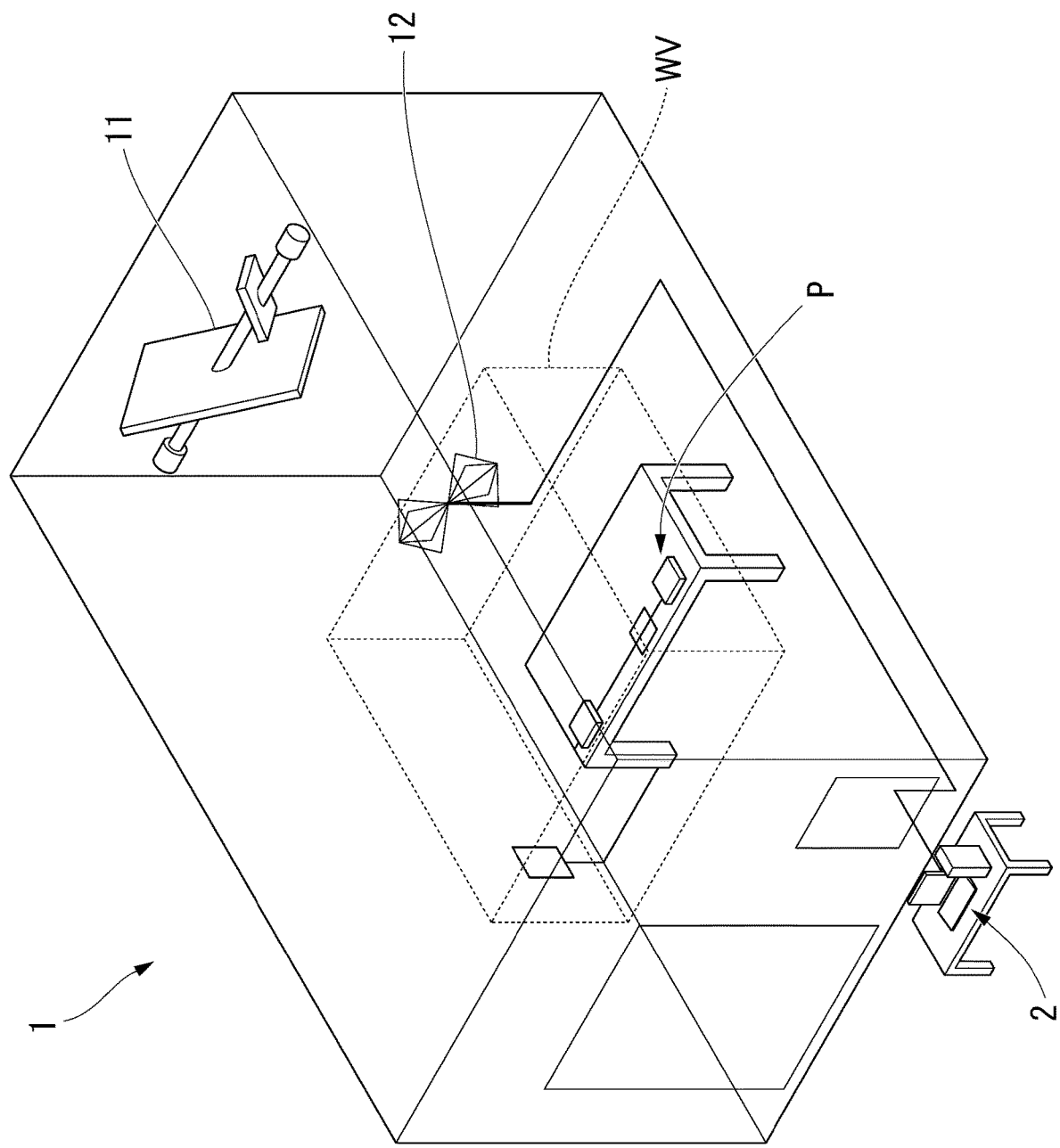
FIG. 1 is a diagram illustrating an example of the configuration of a reflection chamber 1 according to an embodiment.

First, the configuration of a reflection chamber 1 according to the embodiment will be described with reference to FIG. 1. FIG. 1 is a diagram illustrating an example of the configuration of the reflection chamber 1 according to the embodiment.

The reflection chamber 1 is a container inside which radiation electromagnetic field tests (radiation immunity tests) for various kinds of electronic devices are performed. Hereinafter, for the convenience of description, an electronic device that is a target for a radiation electromagnetic field test will be referred to as a target electronic device in description.

In a radiation electromagnetic field test, an estimated electromagnetic environment in which a target electronic device is actually used is produced in a simulating manner. Then, in the radiation electromagnetic field test, it is tested whether or not the target electronic device normally operates in the produced electromagnetic environment. In such a radiation electromagnetic field test, as uniformity of an electric field intensity inside an area including the target electronic device becomes higher, a test result having higher accuracy can be acquired. Here, the uniformity of an electric field intensity inside a certain area is represented using a quantity that represents a variation (for example, a standard deviation, a dispersion, or the like) of the electric field intensity inside the area. In other words, the uniformity of the electric field intensity inside the area becomes higher as the quantity representing the variation of the electric field intensity inside the area becomes smaller.

The reflection chamber 1 includes, for example, an electromagnetic stirrer 11 and an antenna 12. The antenna 12 is connected to an information processing device 2 that is installed outside the reflection chamber 1. The reflection chamber 1 may be configured to include another member in addition to the electromagnetic stirrer 11 and the antenna 12.

The electromagnetic stirrer 11 stirs electromagnetic waves present inside the reflection chamber 1. In accordance with this, the reflection chamber 1 can decrease the variation of the electric field intensity inside a working volume WV in an internal area. The working volume WV is an area in which a target electronic device is installed in the internal area of the reflection chamber 1. In other words, the working volume WV is an area in which a radiation electromagnetic field test is performed in the internal area of the reflection chamber 1. In the example illustrated in FIG. 1, an electronic device P is installed as an example of the target electronic device inside the working volume WV. In other words, a radiation electromagnetic field test for the electronic device P is performed inside the reflection chamber 1. The electromagnetic stirrer 11 stirs electromagnetic waves present inside the working volume WV and decreases the variation of the electric field intensity inside the working volume WV in the radiation electromagnetic field test. The configuration of the electromagnetic stirrer 11 will be described below.

In addition, a rotation mechanism that rotates the electromagnetic stirrer 11 may be configured to be provided in the reflection chamber 1 or may be configured to be provided in the electromagnetic stirrer 11. For example, a motor that supplies a drive force for rotating the electromagnetic stirrer 11, various gears that decelerate the revolution speed of the motor, a support member that supports the electromagnetic stirrer 11, and the like are included in the rotation mechanism.

The antenna 12 radiates electromagnetic waves inside the reflection chamber 1. In addition, the antenna 12 acquires an electrical signal from the information processing device 2 and radiates electromagnetic waves according to the acquired electrical signal. The antenna 12 may be an antenna having any configuration.

The information processing device 2 outputs an electrical signal to the antenna 12 such that electromagnetic waves of a wavelength band desired by a user are radiated from the antenna 12 in accordance with an operation accepted from the user. The information processing device 2 is, for example, a desktop personal computer (PC). In addition, the information processing device 2 may be any other information processing device such as a notebook PC, a tablet PC, a multi-function mobile phone terminal (smartphone), a mobile phone terminal, or a personal digital assistant (PDA).

Configuration Example 1 of Electromagnetic Stirrer

Figure 2:
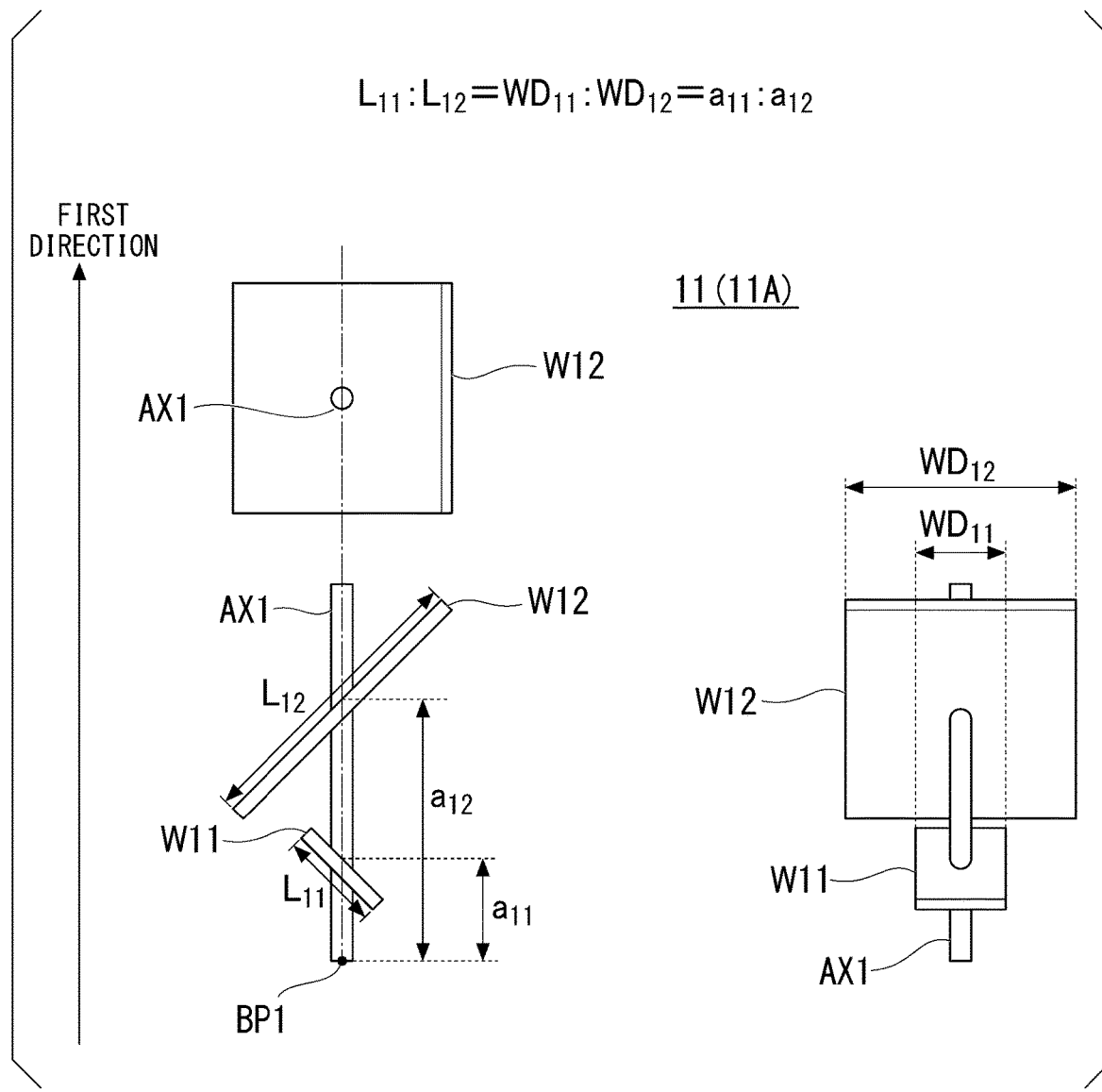
FIG. 2 is a three-side view illustrating an example of the configuration of an electromagnetic stirrer 11.

Hereinafter, Configuration example 1 of the electromagnetic stirrer 11 will be described with reference to FIG. 2. FIG. 2 is a three-side view illustrating an example of the configuration of the electromagnetic stirrer 11. Hereinafter, for the convenience of description, the electromagnetic stirrer 11 illustrated in FIG. 2 will be referred to as an electromagnetic stirrer 11A in description.

The electromagnetic stirrer 11A includes a shaft body AX1 and a plurality of stirring blades disposed on the shaft body AX1. In the example illustrated in FIG. 2, the electromagnetic stirrer 11A includes two stirring blades including a first stirring blade W11 and a second stirring blade W12 as the plurality of stirring blades. In addition, the electromagnetic stirrer 11A may be configured to include other stirring blades in addition to the two stirring blades.

The shaft body AX1 is a member having a rod shape extending from a reference position BP1 of the shaft body AX1 in a first direction. An arrow illustrated in FIG. 2 represents the first direction. In addition, the first direction may be any direction. In the example illustrated in FIG. 2, the reference position BP1 is a position of an end portion that is on a side opposite to the first direction among end portions of the shaft body AX1. In other words, in this example, the shaft body AX1 extends from the reference position BP1 only in the first direction. In addition, the reference position BP1 may be another position on the shaft body AX1. In this case, the shaft body AX1 extends from the reference position BP1 in the first direction and extends from the reference position BP1 also in a direction opposite to the first direction.

The first stirring blade W11 may be a member having any shape as long as it is a member having a face included in an 11th virtual plane that obliquely intersects a center axis of the shaft body AX1 in a case in which it is disposed on the shaft body AX1. Here, in the embodiment, the center axis of the shaft body AX1 and the 11th virtual plane obliquely intersecting each other represents that a smallest angle among angles between the center axis of the shaft body AX1 and the 11th virtual plane is an angle included in a range of equal to or larger than 0 degrees and smaller than 90 degrees. In addition, the 11th virtual plane may be a virtual plane having a thickness or may be a virtual plane having no thickness. The 11th virtual plane is one example of a first virtual plane.

In the example illustrated in FIG. 2, the first stirring blade W11 is a member having a rectangular flat plate shape. For this reason, the first stirring blade W11 has two faces opposite from each other, in other words, an upper face and a lower face. The first stirring blade W11 passes through the shaft body AX1 such that both the upper face and the lower face of the first stirring blade W11 obliquely intersect the center axis of the shaft body AX1. For this reason, each of the upper face and the lower face of the first stirring blade W11 is an example of a face included in the 11th virtual plane. In other words, the first stirring blade W11 is a member that has a face included in the 11th virtual plane in a case in which it is disposed on the shaft body AX1. Hereinafter, as an example, a case in which the upper face of the first stirring blade W11 is handled as a face included in the 11th virtual plane will be described. In the embodiment, the upper face of the first stirring blade W11 is a face positioned on the first direction side among two faces of the first stirring blade W11. In addition, in the embodiment, the lower face of the first stirring blade W11 is a face positioned on a side opposite to the first direction among the two faces of the first stirring blade W11.

Here, in the example illustrated in FIG. 2, the upper face of the first stirring blade W11 obliquely intersects the center axis of the shaft body AX1 at 45°. In other words, in this example, a smallest angle among angles between the upper face of the first stirring blade W11 and the center axis of the shaft body AX1 is 45°. In addition, the smallest angle among angles between the upper face of the first stirring blade W11 and the center axis of the shaft body AX1, instead of 45°, may be an angle larger than 0° and smaller than 45° or may be an angle larger than 45° and smaller than 90°.

In the example illustrated in FIG. 2, the first stirring blade W11 has the shaft body AX1 passing through the position of the center of gravity of the first stirring blade W11. In addition, the first stirring blade W11 may be configured to have the shaft body AX1 passing through another position of the first stirring blade W11 instead of the position of the center of gravity of the first stirring blade W11. In addition, the first stirring blade W11 may be configured to be supported by the shaft body AX1 through a certain support member instead of having the configuration of the shaft body AX1 passing therethrough. Also in this case, the upper face of the first stirring blade W11 is separated from the shaft body AX1 and remains included in the 11th virtual plane. In other words, also in this case, the first stirring blade W11 is a member that has a face included in the 11th virtual plane in a case in which it is disposed on the shaft body AX1.

In addition, the first stirring blade W11 is fastened to the shaft body AX1 by a fastening member and is fixed not to relatively move with respect to the shaft body AX1. For example, the fastening member may be a screw. In addition, the fastening member may be another member such as an O ring that is able to fasten the first stirring blade W11 to the shaft body AX1 instead of a screw.

A distance from the reference position BP1 of the shaft body AX1 to the position of the first stirring blade W11 among distances in the first direction is denoted by $a_{11}$. In this embodiment, the position of the first stirring blade W11 in the first direction is represented using a position of an intersection point between the 11th virtual plane (the upper face of the first stirring blade W11 in the example illustrated in FIG. 2) and the center axis of the shaft body AX1. The position of the intersection point is one example of a position determined in accordance with the shaft body and the first stirring blade.

In the example illustrated in FIG. 2, a length of each of two sides parallel to the center axis of the shaft body AX1 among four sides of the first stirring blade W11 having a rectangular flat plate shape is denoted by $L_{11}$. In addition, in this example, a length of each of two sides obliquely intersecting the center axis of the shaft body AX1 among the four sides of the first stirring blade W11 having a rectangular flat plate shape is denoted by $WD_{11}$.

Here, in this embodiment, a posture of the first stirring blade W11 is represented using a direction from the lower face of the first stirring blade W11 to the upper face of the first stirring blade W11 among two directions orthogonal to the upper face of the first stirring blade W11. In addition, the posture of the first stirring blade W11 may be configured to be represented using another direction in place of this direction.

The second stirring blade W12 is a member having the same shape as the shape of the first stirring blade W11. However, the second stirring blade W12 is a member having a size different from the size of the first stirring blade W11. In other words, the shape of the second stirring blade W12 is similar to the shape of the first stirring blade W11. For this reason, the second stirring blade W12 is a member that has a face included in a 12th virtual plane that obliquely intersecting the center axis of the shaft body AX1 in a case in which it is disposed on the shaft body AX1. In the example illustrated in FIG. 2, the size of the second stirring blade W12 (for example, the area or the like of the upper face of the second stirring blade W12) is larger than the size of the first stirring blade W11 (for example, the area or the like of the upper face of the first stirring blade W11). Here, in this embodiment, the center axis of the shaft body AX1 and the 12th virtual plane obliquely intersecting each other represents that the smallest angle among angles between the center axis of the shaft body AX1 and the 12th virtual plane is an angle included within a range of equal to or larger than 0 degrees and smaller than 90 degrees. The 12th virtual plane may be a virtual plane having a thickness or may be a virtual plane having no thickness. The 12th virtual plane is one example of a second virtual plane.

In the example illustrated in FIG. 2, similar to the first stirring blade W11, the second stirring blade W12 is a member having a rectangular flat plate shape. For this reason, the second stirring blade W12 has two faces opposite from each other, in other words, the upper face and the lower face. The shaft body AX1 passes through the second stirring blade W12 such that both the upper face and the lower face of the second stirring blade W12 obliquely intersect the center axis of the shaft body AX1. For this reason, each of the upper face and the lower face of the second stirring blade W12 is one example of a face included in the 12th virtual plane. In other words, the second stirring blade W12 is a member that has a face included in the 12th virtual plane in a case in which it is disposed on the shaft body AX1. Hereinafter, a case in which the upper face of the second stirring blade W12 is handled as a face included in the 12th virtual plane will be described as an example. In this embodiment, the upper face of the second stirring blade W12 is a face positioned on the first direction side among two faces of the second stirring blade W12. In this embodiment, the lower face of the second stirring blade W12 is a face positioned on a side in a direction opposite to the first direction among the two faces of the second stirring blade W12.

Here, in the example illustrated in FIG. 2, the upper face of the second stirring blade W12 obliquely intersects the center axis of the shaft body AX1 at 45°. In other words, in this example, the smallest angle among angles between the upper face of the second stirring blade W12 and the center axis of the shaft body AX1 is 45°. In addition, the smallest angle among angles between the upper face of the second stirring blade W12 and the center axis of the shaft body AX1 may be an angle larger than 0° and smaller than 45° or may be an angle larger than 45° and smaller than 90° instead of 45°.

In addition, in the example illustrated in FIG. 2, the second stirring blade W12 has the shaft body AX1 passing through the position of the center of gravity of the second stirring blade W12. In addition, the second stirring blade W12 may be configured to have the shaft body AX1 passing through another position of the second stirring blade W12 instead of the position of the center of gravity of the second stirring blade W12. Furthermore, the second stirring blade W12 may be configured to be supported by the shaft body AX1 through a certain support member instead of having the configuration of the shaft body AX1 passing therethrough. Also in this case, the upper face of the second stirring blade W12 is separated from the shaft body AX1 and remains included in the 12th virtual plane. In other words, also in this case, the second stirring blade W12 is a member that has a face included in the 12th virtual plane in a case in which it is disposed on the shaft body AX1.

In addition, the second stirring blade W12 is fastened to the shaft body AX1 by a fastening member and is fixed not to relatively move with respect to the shaft body AX1.

A distance from the reference position BP1 of the shaft body AX1 to the position of the second stirring blade W12 among distances in the first direction is denoted by a12. In this embodiment, the position of the second stirring blade W12 in the first direction is represented using a position of an intersection point between the 12th virtual plane (the upper face of the second stirring blade W12 in the example illustrated in FIG. 2) and the center axis of the shaft body AX1. The position of the intersection point is one example of a position determined in accordance with the shaft body and the second stirring blade.

In the example illustrated in FIG. 2, a length of each of two sides parallel to the center axis of the shaft body AX1 among four sides of the second stirring blade W12 having a rectangular flat plate shape is denoted by $L_{12}$. In addition, in this example, a length of each of two sides obliquely intersecting the center axis of the shaft body AX1 among the four sides of the second stirring blade W12 having a rectangular flat plate shape is denoted by $WD_{12}$.

Here, in this embodiment, a posture of the second stirring blade W12 is represented using a direction from the lower face of the second stirring blade W12 to the upper face of the second stirring blade W12 among two directions orthogonal to the upper face of the second stirring blade W12. In addition, the posture of the second stirring blade W12 may be configured to be represented using another direction in place of this direction.

Here, the distance $a_{12}$ is a distance that is longer than the distance $a_{11}$. In other words, the first stirring blade W11 and the second stirring blade W12 are aligned from the reference position BP1 of the shaft body AX1 in the first direction in order of the first stirring blade W11 and the second stirring blade W12. In accordance with this, two stirring blades that have similar shapes of difference sizes (in other words, the first stirring blade W11 and the second stirring blade W12) rotate in accordance with rotation of the shaft body AX1, and thus the electromagnetic stirrer 11A can stir electromagnetic waves present inside the reflection chamber 1 more disorderly than in a case in which two stirring blade that have the same size and have congruent shapes rotate. As a result, the electromagnetic stirrer 11A can better improve uniformity of the electric field intensity inside the working volume WV compared with in a case in which two stirring blades having the same size and having congruent shapes rotate. As described above, in the electromagnetic stirrer 11A, the size of the first stirring blade W11 is smaller than the size of the second stirring blade W12. For this reason, the electromagnetic stirrer 11A can be formed to be smaller and lighter than in a case in which two stirring blades having congruent shapes of the same size are provided.

In addition, it is preferable that the distance $a_{11}$ and the distance $a_{12}$ be determined such that the first stirring blade W11 and the second stirring blade W12 do not interfere with each other, and the first stirring blade W11 and the second stirring blade W12 do not interfere with other objects in a case in which the electromagnetic stirrer 11A is rotated. As one example of such a determination method, for example, as illustrated in FIG. 2, there is a method in which a ratio between the distance $a_{11}$ and the distance $a_{12}$ is determined to be the same as a similarity ratio between the first stirring blade W11 and the second stirring blade W12. In this case, in the electromagnetic stirrer 11A, the first stirring blade W11 and the second stirring blade W12 can be regarded to have a fractal structure (self-similarity). By causing the electromagnetic stirrer 11A to have a fractal structure, the electromagnetic stirrer 11A can improve uniformity of the electric field intensity inside the working volume WV while inhibiting interference with other objects. The distance $a_{11}$ is one example of a first distance. The distance $a_{12}$ is one example of a second distance.

In addition, in the electromagnetic stirrer 11A, the positions at which the first stirring blade W11 and the second stirring blade W12 are respectively disposed on the shaft body AX1 may be reversed.

Configuration Example 2 of Electromagnetic Stirrer

Figure 3:
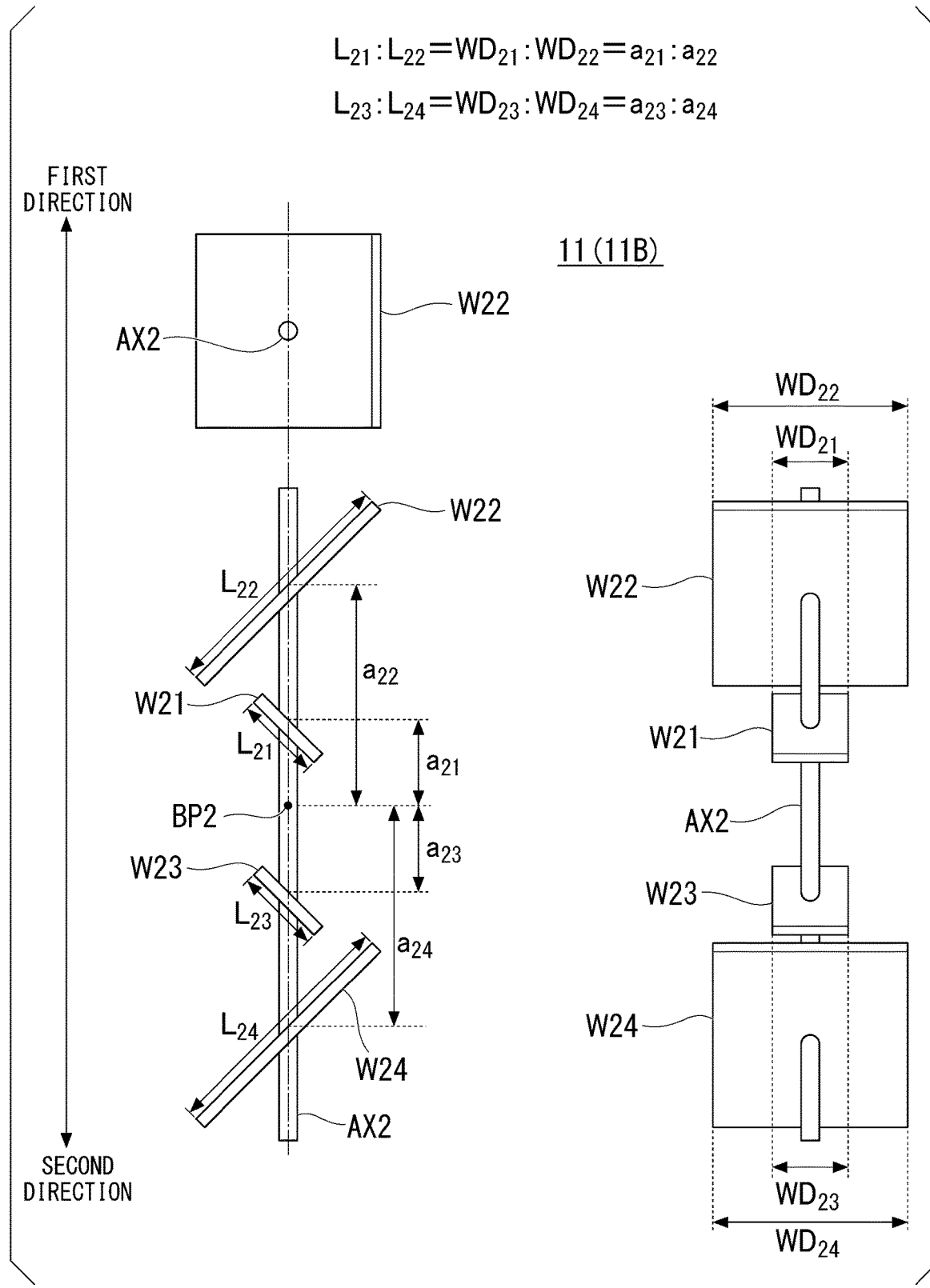
FIG. 3 is a three-side view illustrating another example of the configuration of an electromagnetic stirrer 11.

Hereinafter, Configuration example 2 of the electromagnetic stirrer 11 will be described with reference to FIG. 3. FIG. 3 is a three-side view illustrating another example of the configuration of the electromagnetic stirrer 11. Hereinafter, for the convenience of description, the electromagnetic stirrer 11 illustrated in FIG. 3 will be referred to as an electromagnetic stirrer 11B in description.

The electromagnetic stirrer 11B includes a shaft body AX2 and a plurality of stirring blades disposed on the shaft body AX2. In the example illustrated in FIG. 3, the electromagnetic stirrer 11B includes four stirring blades including a first stirring blade W21, a second stirring blade W22, a third stirring blade W23, and a fourth stirring blade W24 as the plurality of stirring blades. In addition, the electromagnetic stirrer 11B may be configured to include other stirring blades in addition to these four stirring blades.

The shaft body AX2 is a member having a rod shape extending from a reference position BP2 of the shaft body AX2 in a first direction and extending from the reference position BP2 in a second direction that is opposite to the first direction. Arrows illustrated in FIG. 3 represent the first direction and the second direction. In addition, the first direction may be any direction. In the example illustrated in FIG. 3, a reference position BP2 is a position of the center of gravity of the shaft body AX2. In addition, the reference position BP2 may be another position on the shaft body AX2 instead of the position of the center of gravity of the shaft body AX2 as long as it is a position at which the four stirring blades can be disposed.

The first stirring blade W21 may be a member having any shape as long as it is a member having a face included in a 21st virtual plane that obliquely intersects a center axis of the shaft body AX2 in a case in which it is disposed on the shaft body AX2. Here, in the embodiment, the center axis of the shaft body AX2 and the 21st virtual plane obliquely intersecting each other represents that a smallest angle among angles between the center axis of the shaft body AX2 and the 21st virtual plane is an angle included in a range of equal to or larger than 0 degrees and smaller than 90 degrees. In addition, the 21st virtual plane may be a virtual plane having a thickness or may be a virtual plane having no thickness. The 21st virtual plane is one example of a first virtual plane.

In the example illustrated in FIG. 3, the first stirring blade W21 is a member having a rectangular flat plate shape. For this reason, the first stirring blade W21 has two faces opposite from each other, in other words, an upper face and a lower face. The first stirring blade W21 has the shaft body AX2 passing therethrough such that both the upper face and the lower face of the first stirring blade W21 obliquely intersect the center axis of the shaft body AX2. For this reason, each of the upper face and the lower face of the first stirring blade W21 is an example of a face included in the 21st virtual plane. In other words, the first stirring blade W21 is a member that has a face included in the 21st virtual plane in a case in which it is disposed on the shaft body AX2. Hereinafter, as an example, a case in which the upper face of the first stirring blade W21 is handled as a face included in the 21st virtual plane will be described. In the embodiment, the upper face of the first stirring blade W21 is a face positioned on the first direction side among two faces of the first stirring blade W21. In addition, in the embodiment, the lower face of the first stirring blade W21 is a face positioned on a second direction side among the two faces of the first stirring blade W21.

Here, in the example illustrated in FIG. 3, the upper face of the first stirring blade W21 obliquely intersects the center axis of the shaft body AX2 at 45°. In other words, in this example, a smallest angle among angles between the upper face of the first stirring blade W21 and the center axis of the shaft body AX2 is 45°. In addition, the smallest angle among angles between the upper face of the first stirring blade W21 and the center axis of the shaft body AX2, instead of 45°, may be an angle larger than 0° and smaller than 45° or may be an angle larger than 45° and smaller than 90°.

In the example illustrated in FIG. 3, the first stirring blade W21 has the shaft body AX2 passing through the position of the center of gravity of the first stirring blade W21. In addition, the first stirring blade W21 may be configured to have the shaft body AX2 passing through another position of the first stirring blade W21 instead of the position of the center of gravity of the first stirring blade W21. In addition, the first stirring blade W21 may be configured to be supported by the shaft body AX2 through a certain support member instead of having the configuration of the shaft body AX2 passing therethrough. Also in this case, the upper face of the first stirring blade W21 is separated from the shaft body AX2 and remains included in the 21st virtual plane. In other words, also in this case, the first stirring blade W21 is a member that has a face included in the 21st virtual plane in a case in which it is disposed on the shaft body AX2.

In addition, the first stirring blade W21 is fastened to the shaft body AX2 by a fastening member and is fixed not to relatively move with respect to the shaft body AX2.

A distance from the reference position BP2 of the shaft body AX2 to the position of the first stirring blade W21 among distances in the first direction is denoted by $a_{21}$. In this embodiment, the position of the first stirring blade W21 in the first direction is represented using a position of an intersection point between the 21st virtual plane (the upper face of the first stirring blade W21 in the example illustrated in FIG. 3) and the center axis of the shaft body AX2. The position of the intersection point is one example of a position determined in accordance with the shaft body and the first stirring blade.

In the example illustrated in FIG. 3, a length of each of two sides parallel to the center axis of the shaft body AX2 among four sides of the first stirring blade W21 having a rectangular flat plate shape is denoted by $L_{21}$. In addition, in this example, a length of each of two sides obliquely intersecting the center axis of the shaft body AX2 among the four sides of the first stirring blade W21 having a rectangular flat plate shape is denoted by $WD_{21}$.

Here, in this embodiment, a posture of the first stirring blade W21 is represented using a direction from the lower face of the first stirring blade W21 to the upper face of the first stirring blade W21 among two directions orthogonal to the upper face of the first stirring blade W21. In addition, the posture of the first stirring blade W21 may be configured to be represented using another direction in place of this direction.

The second stirring blade W22 is a member having the same shape as the shape of the first stirring blade W21. However, the second stirring blade W22 is a member having a size different from the size of the first stirring blade W21. In other words, the shape of the second stirring blade W22 is similar to the shape of the first stirring blade W21. For this reason, the second stirring blade W22 is a member that has a face included in a 22nd virtual plane that obliquely intersecting the center axis of the shaft body AX2 in a case in which it is disposed on the shaft body AX2. In the example illustrated in FIG. 3, the size of the second stirring blade W22 (for example, the area or the like of the upper face of the second stirring blade W22) is larger than the size of the first stirring blade W21 (for example, the area or the like of the upper face of the first stirring blade W21). Here, in this embodiment, the center axis of the shaft body AX2 and the 22nd virtual plane obliquely intersecting each other represents that the smallest angle among angles between the center axis of the shaft body AX2 and the 22nd virtual plane being an angle included within a range of equal to or larger than 0 degrees and smaller than 90 degrees. The 22nd virtual plane may be a virtual plane having a thickness or may be a virtual plane having no thickness. The 22nd virtual plane is one example of a second virtual plane.

In the example illustrated in FIG. 3, similar to the first stirring blade W21, the second stirring blade W22 is a member having a rectangular flat plate shape. For this reason, the second stirring blade W22 has two faces opposite from each other, in other words, the upper face and the lower face. The shaft body AX2 passes through the second stirring blade W22 such that both the upper face and the lower face of the second stirring blade W22 obliquely intersect the center axis of the shaft body AX2. For this reason, each of the upper face and the lower face of the second stirring blade W22 is one example of a face included in the 22nd virtual plane. In other words, the second stirring blade W22 is a member that has a face included in the 22nd virtual plane in a case in which it is disposed on the shaft body AX2. Hereinafter, as an example, a case in which the upper face of the second stirring blade W22 is handled as a face included in the 22nd virtual plane will be described. In this embodiment, the upper face of the second stirring blade W22 is a face positioned on the first direction side among two faces of the second stirring blade W22. In this embodiment, the lower face of the second stirring blade W22 is a face positioned on the second direction side among the two faces of the second stirring blade W22.

Here, in the example illustrated in FIG. 3, the upper face of the second stirring blade W22 obliquely intersects the center axis of the shaft body AX2 at 45°. In other words, in this example, the smallest angle among angles between the upper face of the second stirring blade W22 and the center axis of the shaft body AX2 is 45°. In addition, the smallest angle among angles between the upper face of the second stirring blade W22 and the center axis of the shaft body AX2 may be an angle larger than 0° and smaller than 45° or may be an angle larger than 45° and smaller than 90° instead of 45°.

In addition, in the example illustrated in FIG. 3, the second stirring blade W22 has the shaft body AX2 passing through the position of the center of gravity of the second stirring blade W22. In addition, the second stirring blade W22 may be configured to have the shaft body AX2 passing through another position of the second stirring blade W22 instead of the position of the center of gravity of the second stirring blade W22. Furthermore, the second stirring blade W22 may be configured to be supported by the shaft body AX2 through a certain support member instead of having the configuration of the shaft body AX2 passing therethrough. Also in this case, the upper face of the second stirring blade W22 is separated from the shaft body AX2 and remains included in the 22nd virtual plane. In other words, also in this case, the second stirring blade W22 is a member that has a face included in the 22nd virtual plane in a case in which it is disposed on the shaft body AX2.

In addition, the second stirring blade W22 is fastened to the shaft body AX2 by a fastening member and is fixed not to relatively move with respect to the shaft body AX2.

A distance from the reference position BP2 of the shaft body AX2 to the position of the second stirring blade W22 among distances in the first direction is denoted by $a_{22}$. In this embodiment, the position of the second stirring blade W22 in the first direction is represented using a position of an intersection point between the 22nd virtual plane (the upper face of the second stirring blade W22 in the example illustrated in FIG. 3) and the center axis of the shaft body AX2. The position of the intersection point is one example of a position determined in accordance with the shaft body and the second stirring blade.

In the example illustrated in FIG. 3, a length of each of two sides parallel to the center axis of the shaft body AX2 among four sides of the second stirring blade W22 having a rectangular flat plate shape is denoted by $L_{22}$. In addition, in this example, a length of each of two sides obliquely intersecting the center axis of the shaft body AX2 among the four sides of the second stirring blade W22 having the rectangular flat plate shape is denoted by $WD_{22}$.

Here, in this embodiment, a posture of the second stirring blade W22 is represented using a direction from the lower face of the second stirring blade W22 to the upper face of the second stirring blade W22 among two directions orthogonal to the upper face of the second stirring blade W22. In addition, the posture of the second stirring blade W22 may be configured to be represented using another direction in place of this direction.

Here, the distance $a_{22}$ is a distance that is longer than the distance $a_{21}$. In other words, the first stirring blade W21 and the second stirring blade W22 are aligned from the reference position BP2 of the shaft body AX2 in the first direction in order of the first stirring blade W21 and the second stirring blade W22.

The third stirring blade W23 may be a member having any shape as long as it is a member having a face included in a 23rd virtual plane that obliquely intersects a center axis of the shaft body AX2 in a case in which it is disposed on the shaft body AX2. Here, in the embodiment, the center axis of the shaft body AX2 and the 23rd virtual plane obliquely intersecting each other represents that a smallest angle among angles between the center axis of the shaft body AX2 and the 23rd virtual plane is an angle included in a range of equal to or larger than 0 degrees and smaller than 90 degrees. In addition, the 23rd virtual plane may be a virtual plane having a thickness or may be a virtual plane having no thickness. The 23rd virtual plane is one example of a third virtual plane.

In the example illustrated in FIG. 3, the shape of the third stirring blade W23 is congruent with the shape of the first stirring blade W21. In other words, the third stirring blade W23 has two faces opposite from each other, in other words, an upper face and a lower face. The third stirring blade W23 has the shaft body AX2 passing therethrough such that both the upper face and the lower face of the third stirring blade W23 obliquely intersect the center axis of the shaft body AX2. For this reason, each of the upper face and the lower face of the third stirring blade W23 is an example of a face included in the 23rd virtual plane. In other words, the third stirring blade W23 is a member that has a face included in the 23rd virtual plane in a case in which it is disposed on the shaft body AX2. Hereinafter, as an example, a case in which the upper face of the third stirring blade W23 is handled as a face included in the 23rd virtual plane will be described. In the embodiment, the upper face of the third stirring blade W23 is a face positioned on the first direction side among two faces of the third stirring blade W23. In addition, in the embodiment, the lower face of the third stirring blade W23 is a face positioned on a second direction side among the two faces of the third stirring blade W23.

Here, in the example illustrated in FIG. 3, the upper face of the third stirring blade W23 obliquely intersects the center axis of the shaft body AX2 at 45°. In other words, in this example, a smallest angle among angles between the upper face of the third stirring blade W23 and the center axis of the shaft body AX2 is 45°. In addition, the smallest angle among angles between the upper face of the third stirring blade W23 and the center axis of the shaft body AX2, instead of 45°, may be an angle larger than 0° and smaller than 45° or may be an angle larger than 45° and smaller than 90°.

In the example illustrated in FIG. 3, the third stirring blade W23 has the shaft body AX2 passing through the position of the center of gravity of the third stirring blade W23. In addition, the third stirring blade W23 may be configured to have the shaft body AX2 passing through another position of the third stirring blade W23 instead of the position of the center of gravity of the third stirring blade W23. In addition, the third stirring blade W23 may be configured to be supported by the shaft body AX2 through a certain support member instead of having the configuration of the shaft body AX2 passing therethrough. Also in this case, the upper face of the third stirring blade W23 is separated from the shaft body AX2 and remains included in the 23rd virtual plane. In other words, also in this case, the third stirring blade W23 is a member that has a face included in the 23rd virtual plane in a case in which it is disposed on the shaft body AX2.

In addition, the third stirring blade W23 is fastened to the shaft body AX2 by a fastening member and is fixed not to relatively move with respect to the shaft body AX2.

A distance from the reference position BP2 of the shaft body AX2 to the position of the third stirring blade W23 among distances in the second direction is denoted by $a_{23}$. In this embodiment, the position of the third stirring blade W23 in the second direction is represented using a position of an intersection point between the 23rd virtual plane (the upper face of the third stirring blade W23 in the example illustrated in FIG. 3) and the center axis of the shaft body AX2. The position of the intersection point is one example of a position determined in accordance with the shaft body and the first stirring blade.

In the example illustrated in FIG. 3, a length of each of two sides parallel to the center axis of the shaft body AX2 among four sides of the third stirring blade W23 having a rectangular flat plate shape is denoted by $L_{23}$. In addition, in this example, a length of each of two sides obliquely intersecting the center axis of the shaft body AX2 among the four sides of the third stirring blade W23 having the rectangular flat plate shape is denoted by $WD_{23}$.

Here, in this embodiment, a posture of the first stirring blade W21 is represented using a direction from the lower face of the third stirring blade W23 to the upper face of the third stirring blade W23 among two directions orthogonal to the upper face of the third stirring blade W23. In addition, the posture of the third stirring blade W23 may be configured to be represented using another direction in place of this direction.

The fourth stirring blade W24 is a member having the same shape as the shape of the third stirring blade W23. However, the fourth stirring blade W24 is a member having a size different from the size of the third stirring blade W23. In other words, the shape of the fourth stirring blade W24 is similar to the shape of the third stirring blade W23. For this reason, the fourth stirring blade W24 is a member that has a face included in a 24th virtual plane that obliquely intersecting the center axis of the shaft body AX2 in a case in which it is disposed on the shaft body AX2. In the example illustrated in FIG. 3, the size of the fourth stirring blade W24 (for example, the area or the like of the upper face of the fourth stirring blade W24) is larger than the size of the third stirring blade W23 (for example, the area or the like of the upper face of the third stirring blade W23). Here, in this embodiment, the center axis of the shaft body AX2 and the 24th virtual plane obliquely intersecting each other represents that the smallest angle among angles between the center axis of the shaft body AX2 and the 24th virtual plane being an angle included within a range of equal to or larger than 0 degrees and smaller than 90 degrees. The 24th virtual plane may be a virtual plane having a thickness or may be a virtual plane having no thickness. The 24th virtual plane is one example of a fourth virtual plane.

In the example illustrated in FIG. 3, the shape of the fourth stirring blade W24 is congruent with the shape of the second stirring blade W22. In other words, the fourth stirring blade W24 has two faces opposite from each other, in other words, an upper face and a lower face. The fourth stirring blade W24 has the shaft body AX2 passing therethrough such that both the upper face and the lower face of the fourth stirring blade W24 obliquely intersect the center axis of the shaft body AX2. For this reason, each of the upper face and the lower face of the fourth stirring blade W24 is an example of a face included in the 24th virtual plane. In other words, the fourth stirring blade W24 is a member that has a face included in the 24th virtual plane in a case in which it is disposed on the shaft body AX2. Hereinafter, as an example, a case in which the upper face of the fourth stirring blade W24 is handled as a face included in the 24th virtual plane will be described. In the embodiment, the upper face of the fourth stirring blade W24 is a face positioned on the first direction side among two faces of the fourth stirring blade W24. In addition, in the embodiment, the lower face of the fourth stirring blade W24 is a face positioned on a second direction side among the two faces of the fourth stirring blade W24.

Here, in the example illustrated in FIG. 3, the upper face of the fourth stirring blade W24 obliquely intersects the center axis of the shaft body AX2 at 45°. In other words, in this example, a smallest angle among angles between the upper face of the fourth stirring blade W24 and the center axis of the shaft body AX2 is 45°. In addition, the smallest angle among angles between the upper face of the fourth stirring blade W24 and the center axis of the shaft body AX2, instead of 45°, may be an angle larger than 0° and smaller than 45° or may be an angle larger than 45° and smaller than 90°.

In the example illustrated in FIG. 3, the fourth stirring blade W24 has the shaft body AX2 passing through the position of the center of gravity of the fourth stirring blade W24. In addition, the fourth stirring blade W24 may be configured to have the shaft body AX2 passing through another position of the fourth stirring blade W24 instead of the position of the center of gravity of the fourth stirring blade W24. In addition, the fourth stirring blade W24 may be configured to be supported by the shaft body AX2 through a certain support member instead of having the configuration of the shaft body AX2 passing therethrough. Also in this case, the upper face of the fourth stirring blade W24 is separated from the shaft body AX2 and remains included in the 24th virtual plane. In other words, also in this case, the fourth stirring blade W24 is a member that has a face included in the 24th virtual plane in a case in which it is disposed on the shaft body AX2.

In addition, the fourth stirring blade W24 is fastened to the shaft body AX2 by a fastening member and is fixed not to relatively move with respect to the shaft body AX2.

A distance from the reference position BP2 of the shaft body AX2 to the position of the fourth stirring blade W24 among distances in the second direction is denoted by $a_{24}$.

In this embodiment, the position of the fourth stirring blade W24 in the second direction is represented using a position of an intersection point between the 24th virtual plane (the upper face of the fourth stirring blade W24 in the example illustrated in FIG. 3) and the center axis of the shaft body AX2. The position of the intersection point is one example of a position determined in accordance with the shaft body and the fourth stirring blade.

In the example illustrated in FIG. 3, a length of each of two sides parallel to the center axis of the shaft body AX2 among four sides of the fourth stirring blade W24 having a rectangular flat plate shape is denoted by $L_{24}$. In addition, in this example, a length of each of two sides obliquely intersecting the center axis of the shaft body AX2 among the four sides of the fourth stirring blade W24 having the rectangular flat plate shape is denoted by $WD_{24}$.

Here, in this embodiment, a posture of the fourth stirring blade W24 is represented using a direction from the lower face of the fourth stirring blade W24 to the upper face of the fourth stirring blade W24 among two directions orthogonal to the upper face of the fourth stirring blade W24. In addition, the posture of the fourth stirring blade W24 may be configured to be represented using another direction in place of this direction.

Here, the distance $a_{24}$ is a distance that is longer than the distance $a_{23}$. In other words, the third stirring blade W23 and the fourth stirring blade W24 are aligned from the reference position BP2 of the shaft body AX2 in the second direction in order of the third stirring blade W23 and the fourth stirring blade W24.

In accordance with this, four stirring blades that have similar shapes of difference sizes (in other words, the first stirring blade W21 to the fourth stirring blade W24) rotate in accordance with rotation of the shaft body AX2, and thus the electromagnetic stirrer 11B can stir electromagnetic waves present inside the reflection chamber 1 more disorderly than the electromagnetic stirrer 11A described above. As a result, the electromagnetic stirrer 11B can improve uniformity of the electric field intensity inside the working volume WV more reliably. In addition, in the electromagnetic stirrer 11B, the size of the first stirring blade W21 is smaller than the size of the second stirring blade W22, and the size of the third stirring blade W23 is smaller than the size of the fourth stirring blade W24. For this reason, the electromagnetic stirrer 11B can be formed to be smaller and lighter than in a case in which four stirring blades having congruent shapes of the same size are provided.

In addition, it is preferable that the distance $a_{21}$ and the distance $a_{22}$ be determined such that the first stirring blade W21 and the second stirring blade W22 do not interfere with each other, and the first stirring blade W21 and the second stirring blade W22 do not interfere with other objects in a case in which the electromagnetic stirrer 11B is rotated. Furthermore, it is preferable that the distance $a_{23}$ and the distance $a_{24}$ be determined such that the third stirring blade W23 and the fourth stirring blade W24 do not interfere with each other, and the third stirring blade W23 and the fourth stirring blade W24 do not interfere with other objects in a case in which the electromagnetic stirrer 11B is rotated. As one example of such a determination method, for example, as illustrated in FIG. 3, there is a method in which a ratio between the distance $a_{21}$ and the distance $a_{22}$ is determined to be the same as a similarity ratio between the first stirring blade W21 and the second stirring blade W22, and a ratio between the distance $a_{23}$ and the distance $a_{24}$ is determined to be the same as a similarity ratio between the third stirring blade W23 and the fourth stirring blade W24. In this case, in the electromagnetic stirrer 11B, the first stirring blade W21 and the second stirring blade W22 can be regarded to have a fractal structure (self-similarity), and the third stirring blade W23 and the fourth stirring blade W24 can be regarded to have a fractal structure (self-similarity). By causing the electromagnetic stirrer 11B to have the fractal structure, the electromagnetic stirrer 11B can improve uniformity of the electric field intensity inside the working volume WV while inhibiting interference with other objects. The distance $a_{21}$ is one example of a first distance. The distance $a_{22}$ is one example of a second distance. The distance $a_{23}$ is one example of a third distance. The distance $a_{24}$ is one example of a fourth distance.

In addition, in the example illustrated in FIG. 3, as described above, the shape of the first stirring blade W21 and the shape of the third stirring blade W23 are congruent, and the shape of the second stirring blade W22 and the shape of the fourth stirring blade W24 are congruent. For this reason, the shape of a combination of the first stirring blade W21 and the second stirring blade W22 and the shape of a combination of the third stirring blade W23 and the fourth stirring blade W24 have mutually self-complementary shapes. In other words, in this example, the shape of the combination of the first stirring blade W21 and the second stirring blade W22 and the shape of the combination of the third stirring blade W23 and the fourth stirring blade W24 are shapes that can be caused to coincide with each other by rotating the shapes around an axis that passes through the reference position BP2 and is orthogonal to the center axis of the shaft body AX2 by 180°. In accordance with this, the electromagnetic stirrer 11B can cause directions in which electromagnetic waves are reflected to be disordered, and as a result, the electromagnetic waves present inside the reflection chamber 1 can be stirred efficiently more reliably.

In addition, in the electromagnetic stirrer 11B, the positions at which the first stirring blade W21 and the second stirring blade W22 are respectively disposed on the shaft body AX2 may be reversed. Furthermore, in the electromagnetic stirrer 11B, the positions at which the third stirring blade W23 and the fourth stirring blade W24 are respectively disposed on the shaft body AX2 may be reversed. In addition, the shape of the first stirring blade W21 and the shape of the third stirring blade W23 may not be congruent. In other words, the shape of the second stirring blade W22 and the shape of the fourth stirring blade W24 may not be congruent.

Configuration Example 3 of Electromagnetic Stirrer

Figure 4:
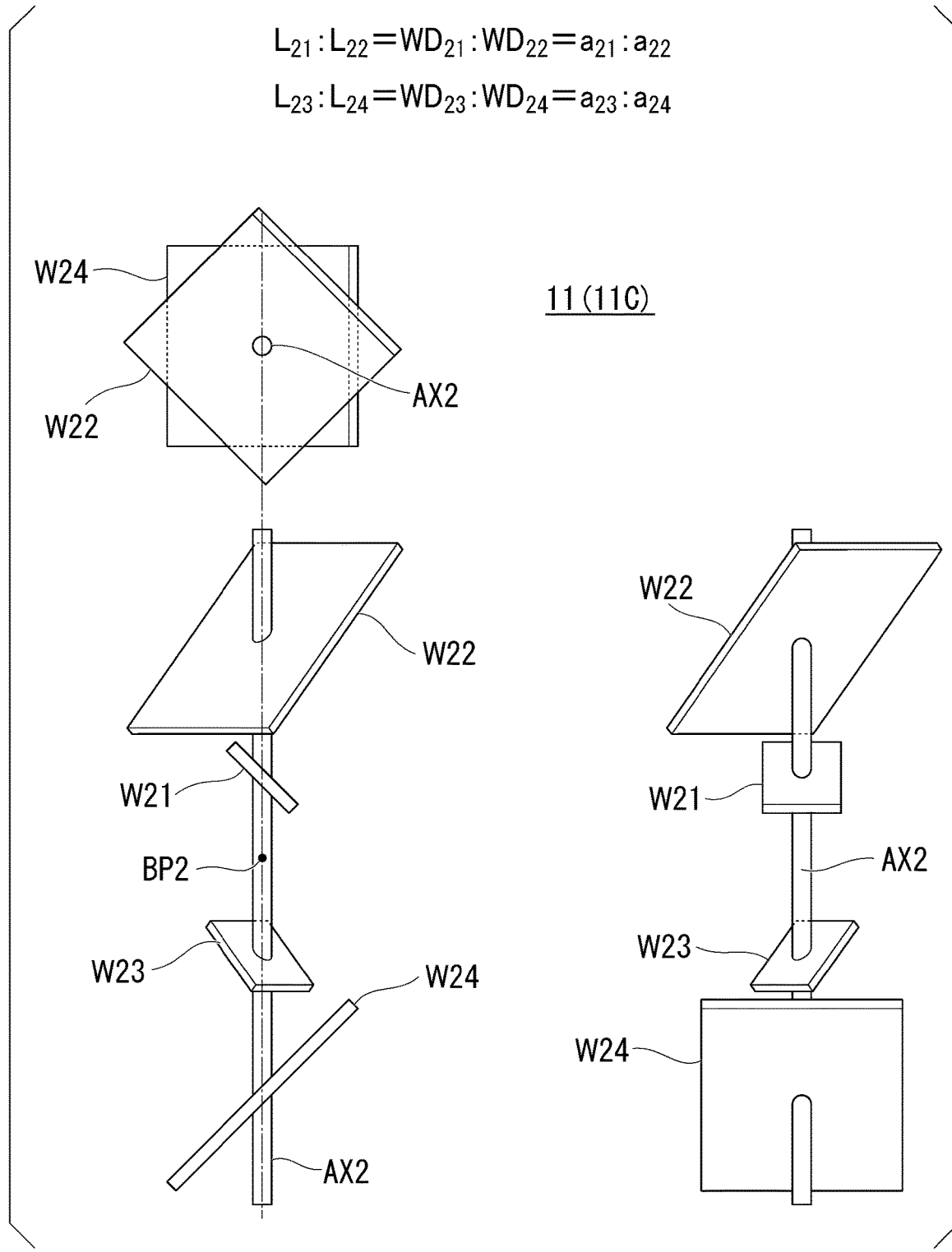
FIG. 4 is a three-side view illustrating yet another example of the configuration of the electromagnetic stirrer 11.

Hereinafter, Configuration example 3 of the electromagnetic stirrer 11 will be described with reference to FIG. 4. FIG. 4 is a three-side view illustrating yet another example of the configuration of the electromagnetic stirrer 11. Hereinafter, for the convenience of description, the electromagnetic stirrer 11 illustrated in FIG. 4 will be referred to as an electromagnetic stirrer 11C in description.

Similar to the electromagnetic stirrer 11B illustrated in FIG. 3, the electromagnetic stirrer 11C includes a shaft body AX2, a first stirring blade W21, a second stirring blade W22, a third stirring blade W23, and a fourth stirring blade W24. However, differently from the electromagnetic stirrer 11B, the electromagnetic stirrer 11C has an asymmetric structure. More specifically, the electromagnetic stirrer 11C has a shape having no rotation symmetry of less than 360° for rotation around the center axis of the shaft body AX2 and a shape having no mirror symmetry with respect to a plane parallel to the center axis of the shaft body AX2 as the asymmetric structure. In order to realize this, in the electromagnetic stirrer 11C, relative postures between the first stirring blade W21, the second stirring blade W22, the third stirring blade W23, and the fourth stirring blade W24 become postures according to a predetermined rule each other. In addition, the electromagnetic stirrer 11C may be configured to include other stirring blades in addition to the first stirring blade W21, the second stirring blade W22, the third stirring blade W23, and the fourth stirring blade W24.

The predetermined rule is such a rule that the posture of a stirring blade aligned in the (2N−1)-th order from a reference position BP2 in a second direction becomes a posture acquired by relatively rotating the posture of a stirring blade aligned in the (2N−1)-th order from the reference position BP2 in a first direction as a reference by a predetermined angle in a predetermined direction around the center axis of the shaft body AX2, and the posture of a stirring blade aligned in the (2N)-th order from the reference position BP2 in the first direction becomes a posture acquired by relatively rotating the posture of a stirring blade aligned in the (2N)-th order from the reference position BP2 in the second direction as a reference by a predetermined angle in a predetermined direction around the center axis of the shaft body AX2. Here, N is an integer that is equal to or greater than 1 and is equal to or smaller than the number of stirring blades included in the electromagnetic stirrer 11C. The predetermined rotation direction is a clockwise direction or a counterclockwise direction. In the example illustrated in FIG. 4, the predetermined direction is the clockwise direction. For example, the predetermined angle is 45°. In addition, instead of 45°, the predetermined angle may be an angle larger than 0° and smaller than 45° or may be an angle larger than 45° and smaller than 180°.

In other words, as illustrated in FIG. 4, in the electromagnetic stirrer 11C, the posture of the third stirring blade W23 is a posture which relatively rotated by a predetermined angle (45° in the example illustrated in FIG. 4) in a predetermined rotation direction (the clockwise direction in the example illustrated in FIG. 4) as the posture of the first stirring blade W21 being a reference. In addition, as illustrated in FIG. 4, in the electromagnetic stirrer 11C, the posture of the second stirring blade W22 is a posture which relatively rotated by a predetermined angle (45° in the example illustrated in FIG. 4) in a predetermined rotation direction (the clockwise direction in the example illustrated in FIG. 4) as the posture of the fourth stirring blade W24 being a reference. In other words, in the electromagnetic stirrer 11C, the first stirring blade W21 to the fourth stirring blade W24 are disposed on the shaft body AX2 in accordance with a predetermined rule. In other words, the electromagnetic stirrer 11C has an asymmetric structure. In accordance with this, the electromagnetic stirrer 11C can cause directions in which electromagnetic waves are reflected by the stirring blades to be more disordered, and as a result, electromagnetic waves present inside the reflection chamber 1 can be stirred more efficiently.

Furthermore, in a case in which such an asymmetric structure is applied to the electromagnetic stirrer 11A, the posture of the second stirring blade W12 needs to be a posture acquired by relatively rotating the posture of the first stirring blade W11 as a reference by a second predetermined angle in a predetermined rotation direction around the center axis of the shaft body AX2 in the electromagnetic stirrer 11A. The second predetermined angle is an angle larger than 0° and smaller than 90° or an angle larger than 90° and larger than 180°.

In addition, the electromagnetic stirrer 11C may be configured to realize an asymmetric structure using another method without using the predetermined rule described above. For example, the electromagnetic stirrer 11C may be configured to realize a shape having no rotation symmetry of less than 360° for rotation around the center axis of the shaft body AX2 and a shape having no mirror symmetry with respect to a plane parallel to the center axis of the shaft body AX2 by configuring the shapes of the first stirring blade W21 to the fourth stirring blade W24 to be shapes different from rectangular flat plate shapes or may have a configuration realized using another method.

In addition, in the electromagnetic stirrer 11C, the shape of the first stirring blade W21 and the shape of the third stirring blade W23 are self-complementary shapes. In other words, in the example illustrated in FIG. 4, the posture of the first stirring blade W21 and the posture of the third stirring blade W23 are postures that can be caused to coincide with each other by mutually rotating the postures around an axis satisfying a predetermined first condition among axes orthogonal to the center axis of the shaft body AX2 by 180°. The predetermined first condition is that the axis is an axis passing through the reference position BP2 in a first intermediate posture direction. The first intermediate posture direction is a direction from one end of a segment equally dividing an angle between a first projection direction in which a direction representing the posture of the first stirring blade W21 having a rectangular flat plate shape is projected onto a plane orthogonal to the center axis of the shaft body AX2 and a second projection direction in which a direction representing the posture of the third stirring blade W23 having a rectangular flat plate shape is projected onto the plane for the plane to the other end. In accordance with this, the electromagnetic stirrer 11C can cause directions in which electromagnetic waves are reflected to be disordered, and the electromagnetic waves present inside the reflection chamber 1 can be efficiently stirred.

In addition, in the electromagnetic stirrer 11C, the shape of the second stirring blade W22 and the shape of the fourth stirring blade W24 are self-complementary shapes. In other words, in the example illustrated in FIG. 4, the posture of the second stirring blade W22 and the posture of the fourth stirring blade W24 are postures that can be caused to coincide with each other by mutually rotating the postures around an axis satisfying a predetermined second condition among axes orthogonal to the center axis of the shaft body AX2 by 180°. The predetermined second condition is that the axis is an axis passing through the reference position BP2 in a second intermediate posture direction. The second intermediate posture direction is a direction from one end of a segment equally dividing an angle between a third projection direction in which a direction representing the posture of the second stirring blade W22 having a rectangular flat plate shape is projected onto a plane orthogonal to the center axis of the shaft body AX2 and a fourth projection direction in which a direction representing the posture of the fourth stirring blade W24 having a rectangular flat plate shape is projected onto the plane for the plane to the other end. In accordance with this, the electromagnetic stirrer 11C can cause directions in which electromagnetic waves are reflected to be disordered, and the electromagnetic waves present inside the reflection chamber 1 can be efficiently stirred.

<Effect of Improvement of Variation of Electric Field Intensity>

Hereinafter, an effect of improvement of variations of the electric field intensity in the working volume WV acquired using the electromagnetic stirrer 11 will be described. The effect of improvement of the electric field intensity inside the working volume WV by using the electromagnetic stirrer 11 tends to be similar in any one of the electromagnetic stirrer 11A to the electromagnetic stirrer 11C. For this reason, hereinafter, the electromagnetic stirrer 11C will be described as an example.

Figure 5:
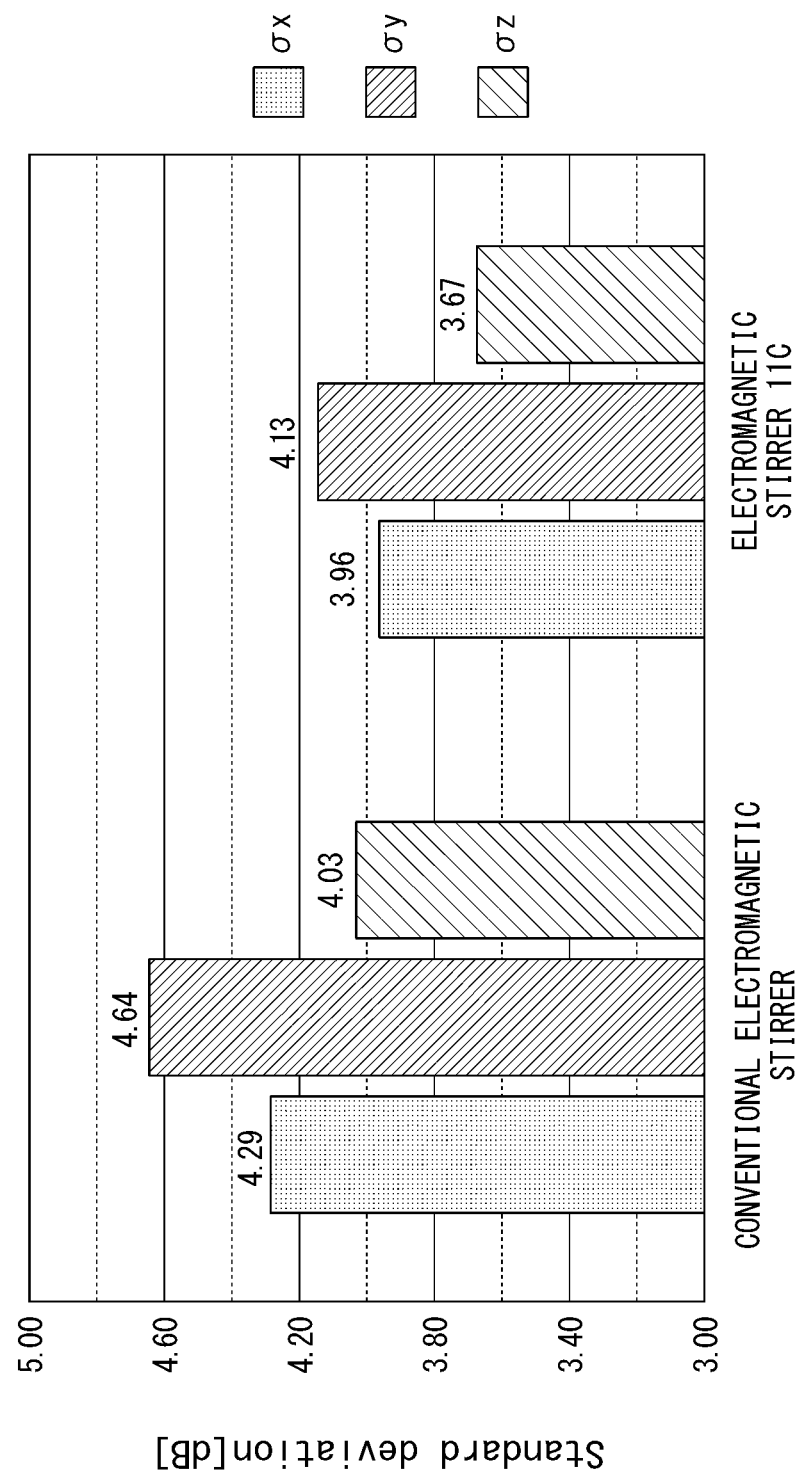
FIG. 5 is a diagram illustrating an example of uniformity of an electric field intensity inside a working volume WV in a case in which an electromagnetic stirrer 11C is used.
Figure 6:
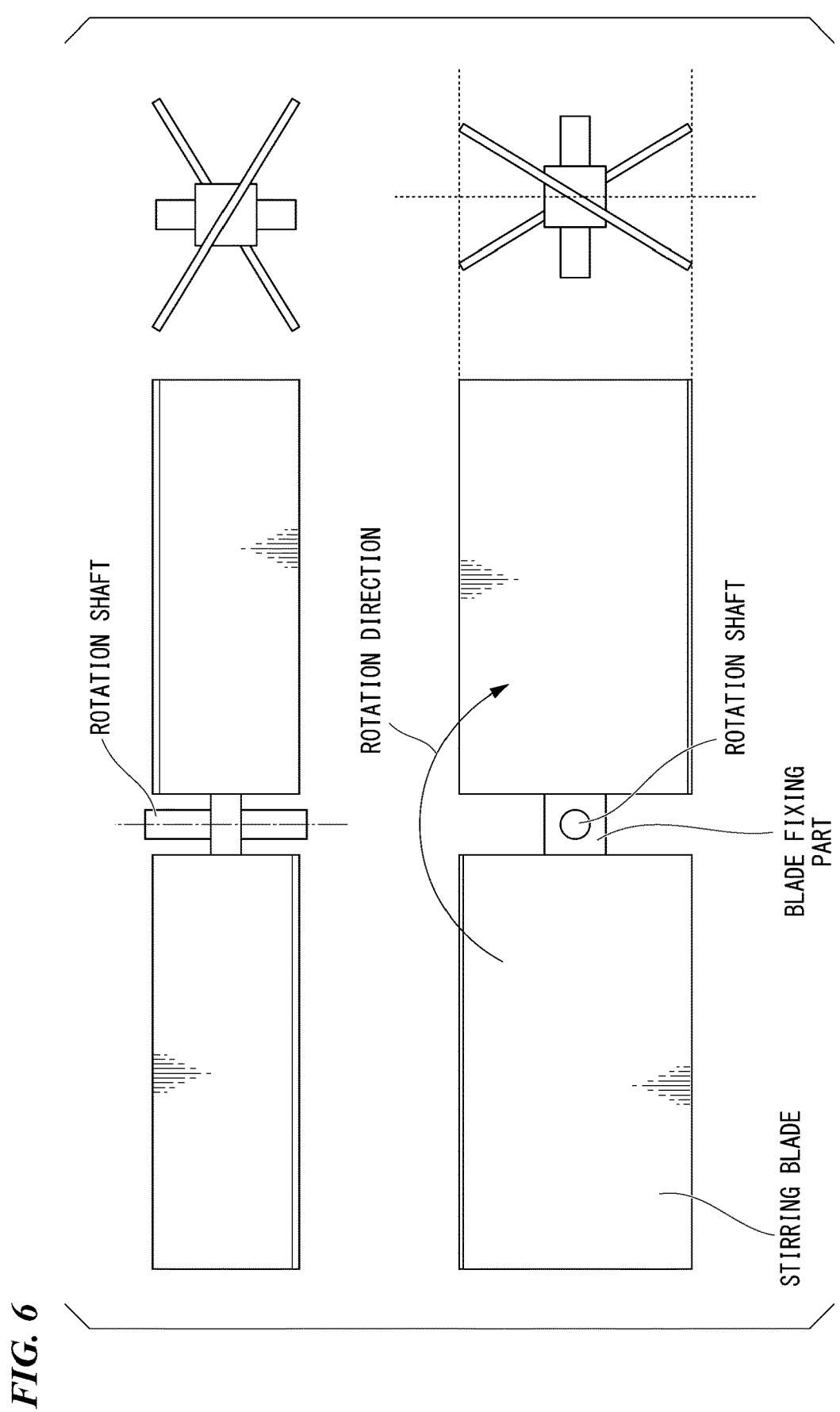
FIG. 6 is a diagram illustrating an example of the configuration of a conventional electromagnetic stirrer.

FIG. 5 is a diagram illustrating an example of uniformity of an electric field intensity inside a working volume WV in a case in which the electromagnetic stirrer 11C is used. FIG. 5 also illustrates an example of uniformity of an electric field intensity inside a working volume WV in a case in which the conventional electromagnetic stirrer illustrated in FIG. 6 is used as a comparison target for the electromagnetic stirrer 11C. FIG. 6 is a diagram illustrating an example of the configuration of a conventional electromagnetic stirrer.

Here, a vertical axis of a histogram illustrated in FIG. 5 represents a standard deviation. As the unit for the vertical axis, decibels is used. $\sigma x$ illustrated in FIG. 5 is a standard deviation representing a variation of the electric field intensity in an X-axis direction of the reflection chamber 1. $\sigma y$ illustrated in FIG. 5 is a standard deviation representing a variation of the electric field intensity in a Y-axis direction of the reflection chamber 1. $\sigma z$ illustrated in FIG. 5 is a standard deviation representing a variation of the electric field intensity in a Z-axis direction of the reflection chamber 1. Here, a Z-axis direction of the reflection chamber 1 is a direction opposite to the direction of the force of gravity. In addition, an X-axis direction of the reflection chamber 1 is one of two directions orthogonal to the Z-axis direction of the reflection chamber 1. Furthermore, a Y-axis direction of the reflection chamber 1 is the other of the two directions orthogonal to the Z-axis direction of the reflection chamber 1.

As illustrated in FIG. 5, it is understood that the variation of the electric field intensity present inside the working volume WV is smaller in a case in which the electromagnetic stirrer 11C is used than in a case in which the conventional electromagnetic stirrer illustrated in FIG. 6 is used. As described above, such a trend is similar also when one of the electromagnetic stirrer 11A to the electromagnetic stirrer 11C and the conventional electromagnetic stirrer are compared with each other. In other words, the electromagnetic stirrer 11 can improve the uniformity of the electric field intensity inside the working volume WV in comparison with a conventional electromagnetic stirrer.

The electromagnetic stirrer 11 described above may be configured to have self-complementary shapes in at least two or more of a plurality of stirring blades included in the electromagnetic stirrer 11 without having the fractal structure and the asymmetric structure described above.

In addition, the electromagnetic stirrer 11 described above may be configured to have asymmetric structures in at least two or more of a plurality of stirring blades included in the electromagnetic stirrer 11 without having the fractal structure and the self-complementary structure described above.

<Configuration of Stirring Blade Supported by Shaft Body Through Support Member>

Figure 7:
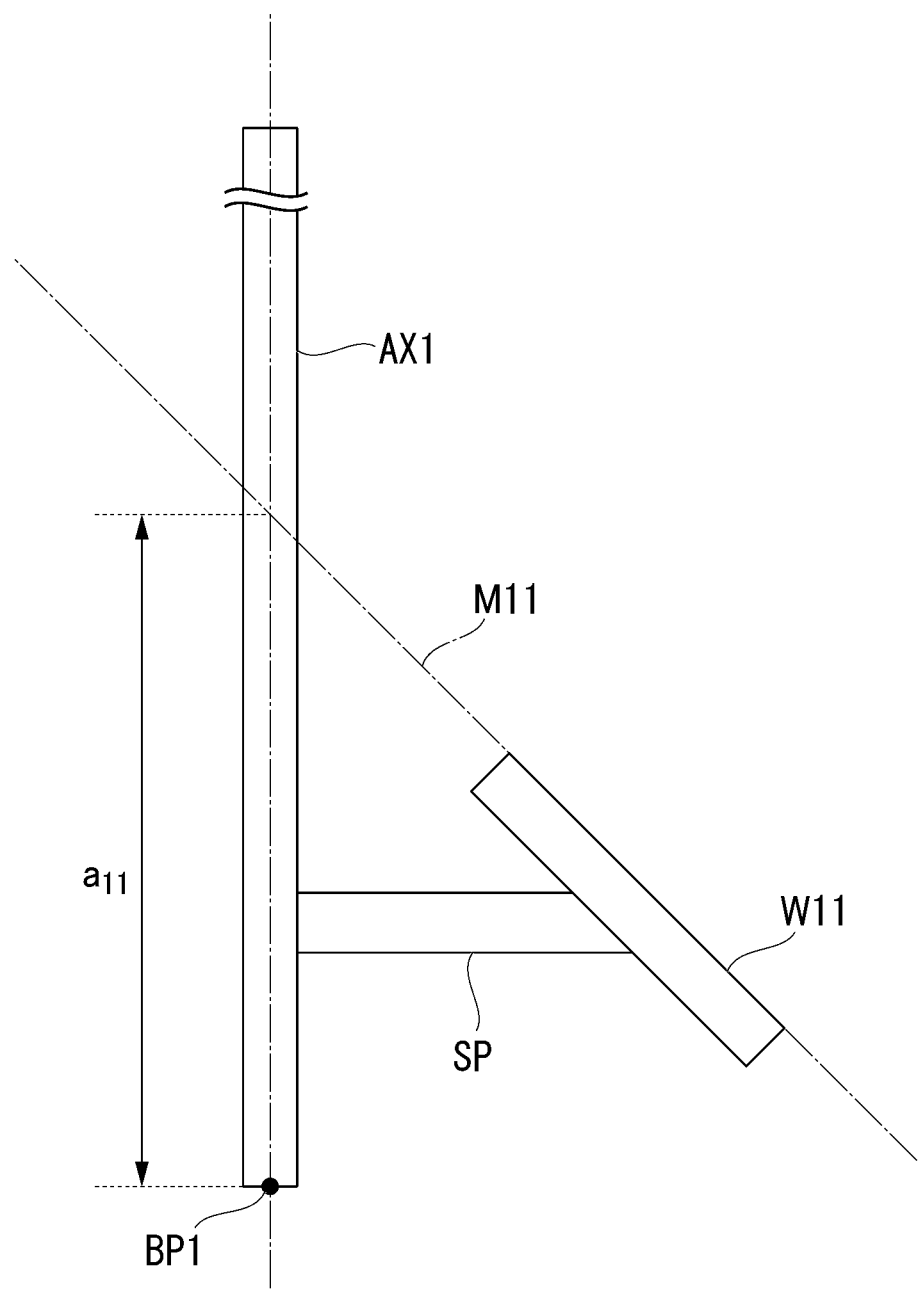
FIG. 7 is a diagram illustrating an example of the configuration of a first stirring blade W11 supported by a shaft body AX1 through a support member.

Hereinafter, the configuration of a stirring blade supported by a shaft body through a support member among stirring blades included in the electromagnetic stirrer 11 will be described with reference to FIG. 7. Hereinafter, the shaft body AX1 and the first stirring blade W11 will be described as an example. FIG. 7 is a diagram illustrating an example of the configuration of a first stirring blade W11 supported by a shaft body AX1 through a support member. The support member SP illustrated in FIG. 7 represents an example of a support member that is disposed in the shaft body AX1 and supports the first stirring blade W11.

The support member SP illustrated in FIG. 7 is a member having a rod shape. In addition, the shape of the support member SP may be any other shape instead of the rod shape. One of two end portions of the support member SP is fastened to the shaft body AX1 not to move using a fastening member such as a screw. In addition, the other of the two end portions of the support member SP is fastened to the first stirring blade W11 not to move using a fastening member such as a screw. In the example illustrated in FIG. 7, the first stirring blade W11 is separated from the shaft body AX1.

Here, a virtual plane M11 illustrated in FIG. 7 represents one example of the 11th virtual plane. In the example illustrated in FIG. 7, the plane M11 includes an upper face of the first stirring blade W11. In other words, the upper face of the first stirring blade W11 is a face included in the plane M11. In other words, in this example, even in a case in which the first stirring blade W11 is disposed on the shaft body AX1 through the support member SP, it is a member having a face included in the plane M11 that is the 11th virtual plane.

The position of the first stirring blade W11 in the first direction is represented using the position of an intersection point between the center axis of the shaft body AX1 and the 11th virtual plane and thus, as illustrated in FIG. 7, is the position of an intersection point between the center axis of the shaft body AX1 and the plane M11. The position of this intersection point is an example of a position that is determined in accordance with the shaft body and the first stirring blade.

In accordance with such a configuration, even in a case in which a stirring blade supported by the shaft body through a certain support member is included in the electromagnetic stirrer 11, similar to the electromagnetic stirrer 11A to the electromagnetic stirrer 11C, uniformity of the electric field intensity inside the working volume can be improved.

As described above, an electromagnetic stirrer (the electromagnetic stirrer 11 and the electromagnetic stirrer 11A to the electromagnetic stirrer 11C in the example described above) according to the embodiment includes: a shaft body (the shaft body AX1 and the shaft body AX2 in the example described above) extending in a first direction; and a plurality of stirring blades disposed on the shaft body, in which the plurality of stirring blades include a first stirring blade (the first stirring blade W11 and the first stirring blade W21 in the example described above) and a second stirring blade (the second stirring blade W12 and the second stirring blade W22 in the example described above), the first stirring blade and the second stirring blade are aligned from a reference position (the reference position BP1 and the reference position BP2 in the example described above) of the shaft body in the first direction in order of the first stirring blade and the second stirring blade, a shape of the first stirring blade and a shape of the second stirring blade are similar to each other, and a size of the first stirring blade is different from a size of the second stirring blade. In accordance with this, the electromagnetic stirrer can improve uniformity of the electric field intensity inside the working volume.

In addition, in the electromagnetic stirrer, a configuration in which a ratio between a first distance (the distance $a_{11}$ and the distance $a_{21}$ in the example described above) from the reference position to a position determined in accordance with the shaft body and the first stirring blade, among distances in the first direction and a second distance (the distance $a_{12}$ and the distance $a_{22}$ in the example described above) from the reference position to a position determined in accordance with the shaft body and the second stirring blade, among the distances in the first direction is the same as a similarity ratio between the first stirring blade and the second stirring blade may be used.

In addition, in the electromagnetic stirrer, a configuration in which each of the first stirring blade and the second stirring blade is a member having a plate shape, the position determined in accordance with the shaft body and the first stirring blade is a position at which a first virtual plane (the 11th virtual plane and the 21st virtual plane in the example described above) including the first stirring blade, and the shaft body intersect each other among positions on the shaft body in the first direction, and the position determined in accordance with the shaft body and the second stirring blade is a position at which a second virtual plane (the 12th virtual plane and the 22nd virtual plane in the example described above) including the second stirring blade, and the shaft body intersect each other, among the positions on the shaft body in the first direction may be used.

In addition, in the electromagnetic stirrer, a configuration in which the shaft body extends also in a second direction that is opposite to the first direction, a third stirring blade (the third stirring blade W23 in the example described above) and a fourth stirring blade (the fourth stirring blade W24 in the example described above) are included in the plurality of stirring blades, the third stirring blade and the fourth stirring blade are aligned from the reference position (the reference position BP2 in the example described above) in the second direction in order of the third stirring blade and the fourth stirring blade, a shape of the third stirring blade and the shape of the first stirring blade are congruent, and a shape of the fourth stirring blade and the shape of the second stirring blade are congruent may be used.

In addition, in the electromagnetic stirrer, a configuration in which a ratio between a third distance (the distance $a_{23}$ in the example described above) from the reference position to a position determined in accordance with the shaft body and the third stirring blade, among distances in the second direction and a fourth distance (the distance $a_{24}$ in the example described above) from the reference position to a position determined in accordance with the shaft body and the fourth stirring blade, among the distances in the second direction is the same as a similarity ratio between the third stirring blade and the fourth stirring blade may be used.

In addition, in the electromagnetic stirrer, a configuration in which each of the third stirring blade and the fourth stirring blade is a member having a plate shape, the position determined in accordance with the shaft body and the third stirring blade is a position at which a third virtual plane (the 23rd virtual plane in the example described above) including the third stirring blade and the shaft body intersect each other among positions on the shaft body in the second direction, and the position determined in accordance with the shaft body and the fourth stirring blade is a position at which a fourth virtual plane (the 24th virtual plane in the example described above) including the fourth stirring blade and the shaft body intersect each other among the positions on the shaft body in the second direction may be used.

In addition, in the electromagnetic stirrer, a configuration in which the electromagnetic stirrer has a shape having no rotation symmetry of less than 360° for rotation around a center axis of the shaft body and has a shape having no mirror symmetry for a plane parallel to the center axis of the shaft body may be used.

In addition, in the electromagnetic stirrer, a configuration in which a posture of the third stirring blade is relatively rotated by a predetermined angle (45° in the example described above) in a first rotation direction (a clockwise direction in the case of being in the first direction in the example described above) among two directions around the center axis of the shaft body as the posture of the first stirring blade being a reference, and a posture of the second stirring blade is relatively rotated by a predetermined angle in the first rotation direction as the posture of the fourth stirring blade being a reference may be used.

Furthermore, an electromagnetic stirrer includes: a shaft body extending in a first direction; and a plurality of stirring blades disposed on the shaft body, the plurality of stirring blades include a first stirring blade and a second stirring blade, and a shape of at least one of the first stirring blade and the second stirring blade is a self-complementary shape. In accordance with this, the electromagnetic stirrer can improve uniformity of the electric field intensity inside the working volume.

In addition, an electromagnetic stirrer includes: a shaft body extending in a first direction; and a plurality of stirring blades disposed on the shaft body, in which the electromagnetic stirrer has a shape having no rotation symmetry of less than 360° for rotation around the center axis of the shaft body and has a shape having no mirror symmetry with respect to a plane parallel to the center axis of the shaft body. In accordance with this, the electromagnetic stirrer can improve uniformity of the electric field intensity inside the working volume.

As above, the embodiment of the present invention has been described with reference to the drawings, a specific configuration is not limited to this embodiment, and alterations, substitutions, omissions, and the like may be made without departing from the concept of the present invention.

REFERENCE SIGNS LIST 1 reflection chamber
2 information processing device
11, 11A, 11B, 11C electromagnetic stirrer
12 antenna
AX1, AX2 shaft body
BP1, BP2 reference position
M11 plane
P electronic device
W11, W21 first stirring blade
W12, W22 second stirring blade
W23 third stirring blade
W24 fourth stirring blade
WV working volume

The invention claimed is:

1. An electromagnetic stirrer comprising:
a shaft body extending in a first direction; and
a first stirring blade and a second stirring blade on the shaft body,
wherein
the first stirring blade and the second stirring blade are aligned from a reference position of the shaft body in the first direction in order of the first stirring blade and the second stirring blade,
a shape of the first stirring blade and a shape of the second stirring blade are similar to each other,
a size of the first stirring blade is different from a size of the second stirring blade, and
a ratio between a first distance from the reference position to a position determined in accordance with the shaft body and the first stirring blade, among distances in the first direction, and a second distance from the reference position to a position determined in accordance with the shaft body and the second stirring blade, among the distances in the first direction, is the same as a similarity ratio between the first stirring blade and the second stirring blade.

2. The electromagnetic stirrer according to claim 1, wherein
each of the first stirring blade and the second stirring blade has a plate shape,
the position determined in accordance with the shaft body and the first stirring blade is at a first virtual plane including the first stirring blade, and the shaft body intersect each other among positions on the shaft body in the first direction, and
the position determined in accordance with the shaft body and the second stirring blade is at a second virtual plane including the second stirring blade, and the shaft body intersect each other, among the positions on the shaft body in the first direction.

3. A reflection chamber comprising the electromagnetic stirrer according to claim 2.

4. The electromagnetic stirrer according to claim 1, wherein the electromagnetic stirrer has a shape having no rotation symmetry of less than 360° for rotation around a center axis of the shaft body and has a shape having no mirror symmetry for a plane parallel to the center axis of the shaft body.

5. A reflection chamber comprising the electromagnetic stirrer according to claim 4.

6. A reflection chamber comprising the electromagnetic stirrer according to claim 1.

7. An electromagnetic stirrer comprising:
a shaft body extending in a first direction; and
a first stirring blade, a second stirring blade, a third stirring blade and a fourth stirring blade on the shaft body, wherein
the first stirring blade and the second stirring blade are aligned from a reference position of the shaft body in the first direction in order of the first stirring blade and the second stirring blade,
a shape of the first stirring blade and a shape of the second stirring blade are similar to each other,
a size of the first stirring blade is different from a size of the second stirring blade,
the shaft body extends in a second direction that is opposite to the first direction,
the third stirring blade and the fourth stirring blade are aligned from the reference position in the second direction in order of the third stirring blade and the fourth stirring blade,
a shape of the third stirring blade and the shape of the first stirring blade are congruent, and
a shape of the fourth stirring blade and the shape of the second stirring blade are congruent.

8. The electromagnetic stirrer according to claim 7, wherein a ratio between a third distance from the reference position to a position determined in accordance with the shaft body and the third stirring blade, among distances in the second direction, and a fourth distance from the reference position to a position determined in accordance with the shaft body and the fourth stirring blade, among the distances in the second direction, is the same as a similarity ratio between the third stirring blade and the fourth stirring blade.

9. A reflection chamber comprising the electromagnetic stirrer according to claim 8.

10. The electromagnetic stirrer according to claim 8, wherein each of the third stirring blade and the fourth stirring blade is a has a plate shape, the position determined in accordance with the shaft body and the third stirring blade is at a third virtual plane including the third stirring blade, and the shaft body intersect each other among positions on the shaft body in the second direction, and the position determined in accordance with the shaft body and the fourth stirring blade is at a fourth virtual plane including the fourth stirring blade and the shaft body intersect each other, among the positions on the shaft body in the second direction.

11. A reflection chamber comprising the electromagnetic stirrer according to claim 10.

12. The electromagnetic stirrer according to claim 7, wherein the electromagnetic stirrer has a shape having no rotation symmetry of less than 360° for rotation around a center axis of the shaft body and has a shape having no mirror symmetry for a plane parallel to the center axis of the shaft body.

13. The electromagnetic stirrer according to claim 12, wherein a posture of the third stirring blade is relatively rotated by a predetermined angle in a first rotation direction among two directions around the center axis of the shaft body as the posture of the first stirring blade being a reference, and a posture of the second stirring blade is relatively rotated by a predetermined angle in the first rotation direction as the posture of the fourth stirring blade being a reference.

14. A reflection chamber comprising the electromagnetic stirrer according to claim 13.

15. A reflection chamber comprising the electromagnetic stirrer according to claim 12.

16. A reflection chamber comprising the electromagnetic stirrer according to claim 7.

17. An electromagnetic stirrer comprising:

a shaft body extending in a first direction; and a first stirring blade and a second stirring blade on the shaft body, wherein a shape of at least one of the first stirring blade and the second stirring blade can be caused to coincide with the other of the first stirring blade and the second stirring blade by rotating the at least one of the first stirring blade and the second stirring blade around an axis that is orthogonal to a center axis of the shaft body by 180°.

18. A reflection chamber comprising the electromagnetic stirrer according to claim 17.

* * * * *